(12) United States Patent
Cui (10) Patent No.: US 10,084,155 B2
(45) Date of Patent: Sep. 25, 2018

(54) OLED DISPLAY

(71) Applicant: Wuhan China Star Optoelectronics Technology Co., Ltd., Wuhan (CN)

(72) Inventor: Lei Cui, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 113 days.

(21) Appl. No.: 15/329,232

(22) PCT Filed: Dec. 13, 2016

(86) PCT No.: PCT/CN2016/109570
§ 371 (c)(1),
(2) Date: Jan. 25, 2017

(87) PCT Pub. No.: WO2018/076483
PCT Pub. Date: May 3, 2018

(65) Prior Publication Data
US 2018/0248153 A1      Aug. 30, 2018

(30) Foreign Application Priority Data
Oct. 31, 2016   (CN) .......................... 2016 1 0933085

(51) Int. Cl.
*H01L 51/52*        (2006.01)
*H01L 27/32*        (2006.01)

(52) U.S. Cl.
CPC ...... *H01L 51/5256* (2013.01); *H01L 27/3244* (2013.01)

(58) Field of Classification Search
None
See application file for complete search history.

(56) References Cited

U.S. PATENT DOCUMENTS

| 9,696,838 B2 * | 7/2017 | Lee ........................ G06F 3/0412 |
| 2003/0094615 A1 * | 5/2003 | Yamazaki ............... H01L 27/12 257/72 |

(Continued)

FOREIGN PATENT DOCUMENTS

| CN | 105098090 A | 11/2015 |
| CN | 106058076   | 10/2016 |

*Primary Examiner* — Michelle Mandala
(74) *Attorney, Agent, or Firm* — Leong C. Lei (57) ABSTRACT

The OLED display of the invention comprises a TFE layer, comprising: inorganic passivation layers, organic buffer layers and a moisture/oxygen quenching layer (MOQL), wherein the inorganic passivation layers and the organic buffer layers form a stacked structure, and the MOQL comprises a first MOQL located between the stack structure and OLED layer, or a second MOQL located between the two inorganic passivation layers, or a combination of two. In TFE layer, the MOQL can effectively prevent, through physisorption or chemical reaction, the damage of the OLED device caused by moisture/oxygen without affecting the luminescence performance of the OLED device so as to enhance the OLED device lifespan, and release the stress of inorganic passivation layers in TFE layer, reduce the number of layers and thickness of the TFE layer, thereby reduce the thickness of the OLED display and improve the flexibility of flexible OLED display.

18 Claims, 10 Drawing Sheets

(56) References Cited

U.S. PATENT DOCUMENTS

2016/0190511 A1\* 6/2016 Choi ................... H01L 51/5253
                                                    257/40
2016/0226014 A1\* 8/2016 Yoneda ............... H01L 51/5253

\* cited by examiner

OLED DISPLAY

BACKGROUND OF THE INVENTION

1. Field of the Invention

The present invention relates to the field of panel display techniques, and in particular to an OLED display.

2. The Related Arts

The organic light-emitting diode (OLED) display has the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

The known popular OLED displays usually adopt a top-emitting structure. The OLED device comprises an anode, an organic layer and a cathode, wherein the anode is usually a three-layered structure of ITO/Ag/ITO, wherein ITO is indium tin oxide and with a high work function and a high reflectance. The organic layer comprises a hole inject layer, a hole transport layer, a light-emitting layer, an electron transport layer and an electron inject layer. The cathode is an alloy with a low work function Mg and Ag (Mg/Ag).

Figure 1:
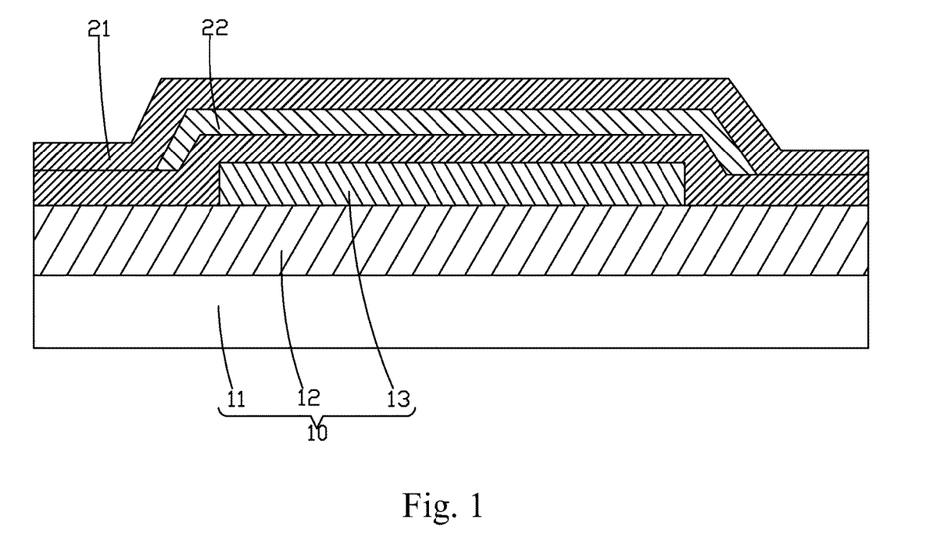
FIG. 1 is a schematic view showing the structure of a known OLED display.

Because the organic layer and the cathode are very sensitive to water and oxygen, a variety of means are required to encapsulate the organic light emitting device in preparing the flexible OLED screen. Currently, thin film encapsulation (TFE) technology has been successfully applied to flexible OLED display. As shown in FIG. 1, the most popular technique for TFE is that the polymer organic thin film 21 and the inorganic thin film 22 are alternately deposited on the surface of the flexible OLED substrate 10, wherein the flexible OLED substrate 10 comprises a substrate 11, a TFT layer 12 on the substrate 11, and an OLED layer 13 on the TFT layer 12. The inorganic thin film 22 of the TFE layer has a good moisture/oxygen blocking property, and the polymer organic thin film 21 can absorb and disperse the stress between the layers to avoid the generation of cracks in the dense inorganic thin film 22, which leads to reducing the blocking property against water and oxygen.

Figure 2:
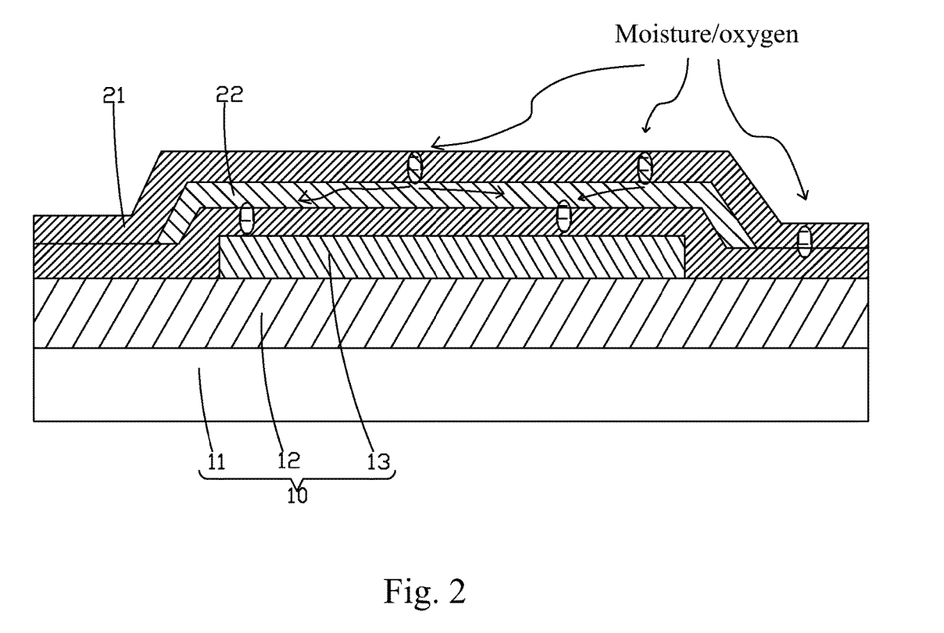
FIG. 2 is a schematic view showing the defects in the inorganic thin film of the OLED display of FIG. 1 eroded by the moisture/oxygen.

As shown in FIG. 2, a small amount of particles is inevitably introduced during the film formation of the TFE layer, resulting in generation of defects (voids, microcracks, and so on) in the inorganic thin film 22. In addition, the inorganic thin film 22 in the TFE layer may generate new defects or increase the original defects during the subsequent fabrication process, or the use of the screen (external shock, bending, falling). And these defects will become the channels of moisture/oxygen permeation, reducing the TFE layer of water blocking properties, so that the moisture/oxygen in atmospheric environment contact the OLED light-emitting devices, affecting the lifespan of the OLED light-emitting devices.

SUMMARY OF THE INVENTION

The object of the present invention is to provide an OLED display, having a TFE layer with one or more layers of moisture/oxygen quenching layer (MOQL) to effectively prevent the moisture/oxygen from damaging the OLED devices so as to improve the lifespan if the OLED devices, as well as releasing the stress in the inorganic passivation layer of the TFE layer to reduce the number of layers and the thickness of the TFE layer so as to reduce the overall thickness of the OLED display and improve the flexibility.

To achieve the above object, the present invention provides an OLED display, which comprises: a base substrate, a thin film transistor (TFT) array layer disposed on the base substrate, an OLED layer disposed on the TFT array layer, and a thin film encapsulation (TFE) layer on the TFT array layer and the OLED layer and covering the OLED layer; the TFE layer comprising: inorganic passivation layers, organic buffer layers and a moisture/oxygen quenching layer (MOQL), the inorganic passivation layers and the organic buffer layers being alternatively stacked in the TFE layer, with the number of the inorganic passivation layers being more than the number of the organic buffer layers by one layer, and the inorganic passivation layers and the organic buffer layers forming a stack structure; the MOQL comprising a first MOQL, a second MOQL, or a combination of the above two, wherein the first MOQL being disposed on the OLED layer located between the stack structure and the OLED layer, and the second MOQL being disposed inside the stack structure, located between two inorganic passivation layers.

According to a preferred embodiment of the present invention, the OLED display comprises an active area at the center and a non-active area surrounding the active area; the active area comprises a plurality of sub-pixel areas arranged in an array, and a plurality of remaining gap areas; the first MOQL comprises a ring-shaped peripheral portion and a center portion located inside the ring-shaped peripheral portion; the peripheral portion is disposed to correspond to the non-active area and the center portion is distributed correspondingly to the gap areas inside the active area; the center portion is an entirety of a network structure corresponding to the gap areas or a combination of a plurality of quenching individuals distributed in the gap area.

According to a preferred embodiment of the present invention, the material for the first MOQL comprises alkali metals, alkaline earth metals, or alloys of the above two.

According to a preferred embodiment of the present invention, the material for the first MOQL comprises one of Li, Na, K, Ru, Cs, Mg, Ca, and Ba or alloys of the above.

According to a preferred embodiment of the present invention, the quenching individual is round, rectangular or L-shaped; each quenching individual corresponds to one or more sub-pixel areas, or each sub-pixel area corresponds a plurality of quenching individuals.

According to a preferred embodiment of the present invention, the thickness of the first MOQL and the thickness of the second MOQL are both 5 nm-100 nm.

According to a preferred embodiment of the present invention, the second MOQL is located between an inorganic passivation layer and an organic buffer layer, the upper and lower surfaces of the second MOQL contact the organic buffer layer and the inorganic passivation layer respectively; the second MOQL is made of a physisorption material with diaphaneity and hygroscopicity.

According to a preferred embodiment of the present invention, the second MOQL is located between an inorganic passivation layer and an organic buffer layer, the upper and lower surfaces of the second MOQL contact the inorganic passivation layer and the organic buffer layer respectively; the second MOQL is made of a physisorption material with diaphaneity and hygroscopicity.

According to a preferred embodiment of the present invention, the second MOQL is a film layer formed by a physisorption material with diaphaneity and hygroscopicity uniformly distributed in an organic material, and the second MOQL also serves as an organic buffer layer.

According to a preferred embodiment of the present invention, the second MOQL is a film layer formed by a physisorption material of granular shape uniformly distributed in an organic material.

Another embodiment of the present invention provides an OLED display, which comprises: a base substrate, a thin film transistor (TFT) array layer disposed on the base substrate, an OLED layer disposed on the TFT array layer, and a thin film encapsulation (TFE) layer on the TFT array layer and the OLED layer and covering the OLED layer; the TFE layer comprising: inorganic passivation layers, organic buffer layers and a moisture/oxygen quenching layer (MOQL), the inorganic passivation layers and the organic buffer layers being alternatively stacked in the TFE layer, with the number of the inorganic passivation layers being more than the number of the organic buffer layers by one layer, and the inorganic passivation layers and the organic buffer layers forming a stack structure; the MOQL comprising a first MOQL, a second MOQL, or a combination of the above two, wherein the first MOQL being disposed on the OLED layer located between the stack structure and the OLED layer, and the second MOQL being disposed inside the stack structure, located between two inorganic passivation layers; wherein the thickness of the first MOQL and the thickness of the second MOQL being both 5 nm-100 nm; wherein the OLED display comprising an active area at the center and a non-active area surrounding the active area; the active area comprising a plurality of sub-pixel areas arranged in an array, and a plurality of remaining gap areas; the first MOQL comprising a ring-shaped peripheral portion and a center portion located inside the ring-shaped peripheral portion; the peripheral portion beings disposed to correspond to the non-active area and the center portion beings distributed correspondingly to the gap areas inside the active area; the center portion being an entirety of a network structure corresponding to the gap areas or a combination of a plurality of quenching individuals distributed in the gap area.

Compared to the known techniques, the present invention provides the following advantages. The OLED display of the present invention comprises a TFE layer, which comprises: inorganic passivation layers, organic buffer layers and a moisture/oxygen quenching layer (MOQL), wherein the inorganic passivation layers and the organic buffer layers together form a stacked structure, and the moisture/oxygen quenching layer comprises a first MOQL located between the stack structure and the OLED layer, or a second MOQL located between the two inorganic passivation layers in the stack structure, or a combination of the two. In the TFE layer, the MOQL can effectively prevent, through the physisorption or the chemical reaction and collaborating with the inorganic passivation layer and the organic buffer layer, the damage of the OLED device caused by the moisture/oxygen without affecting the luminescence performance of the OLED device so as to enhance the lifespan of OLED devices, as well as release the stress of the inorganic passivation layers in the TFE layer, reduce the number of layers and thickness of the TFE layer, thereby reduce the thickness of the OLED display and improve the flexibility of flexible OLED display.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 3:
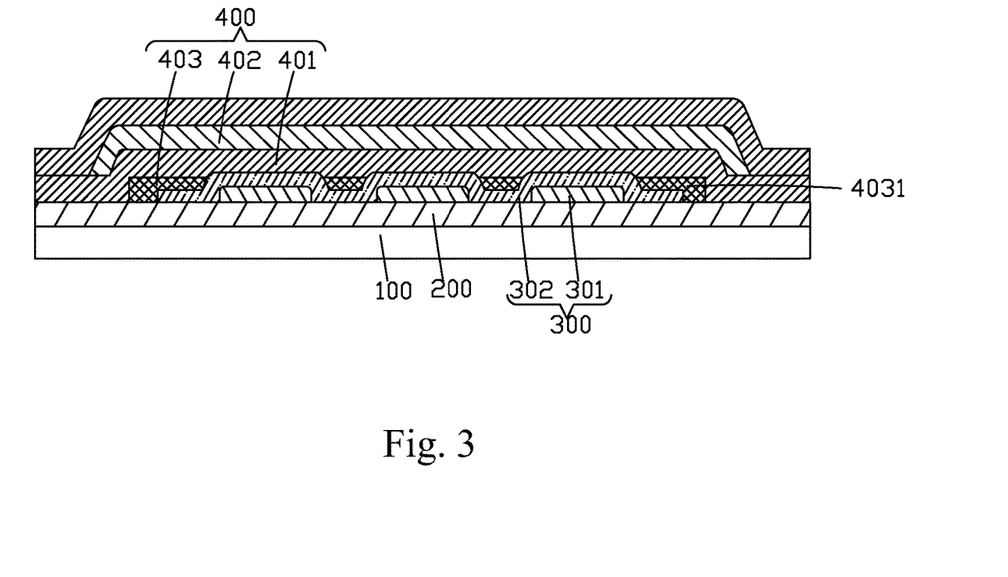
FIG. 3 is a schematic view showing the structure of the first embodiment of the OLED display provided by an embodiment of the present invention.
Figure 4:
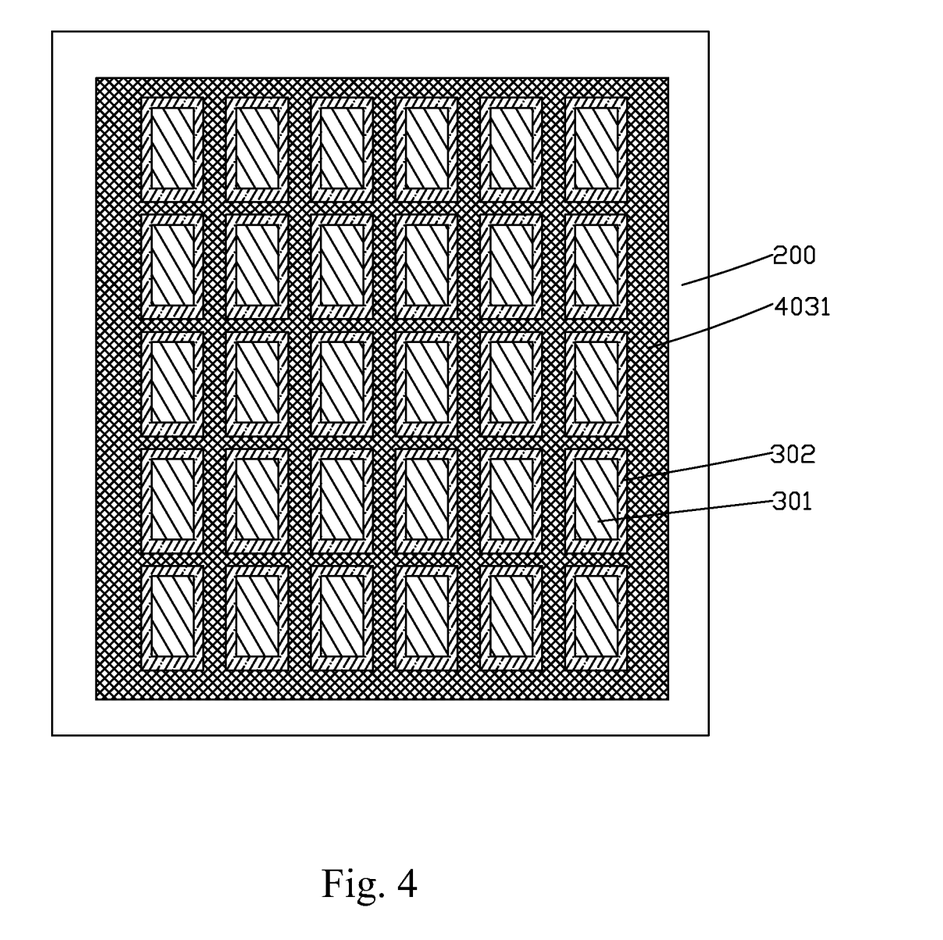
FIG. 4 is a schematic view showing the first shape of the first MOQL in the first embodiment of the OLED display provided by an embodiment of the present invention.
Figure 5:
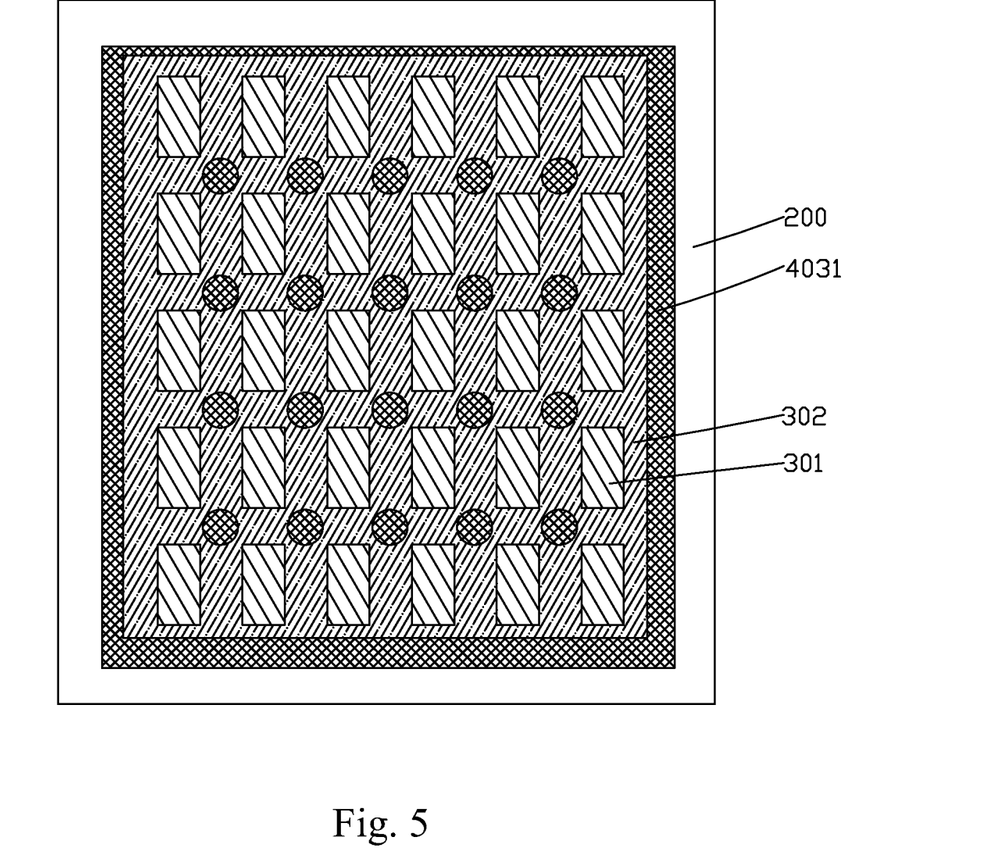
FIG. 5 is a schematic view showing the second shape of the first MOQL in the first embodiment of the OLED display provided by an embodiment of the present invention.
Figure 6:
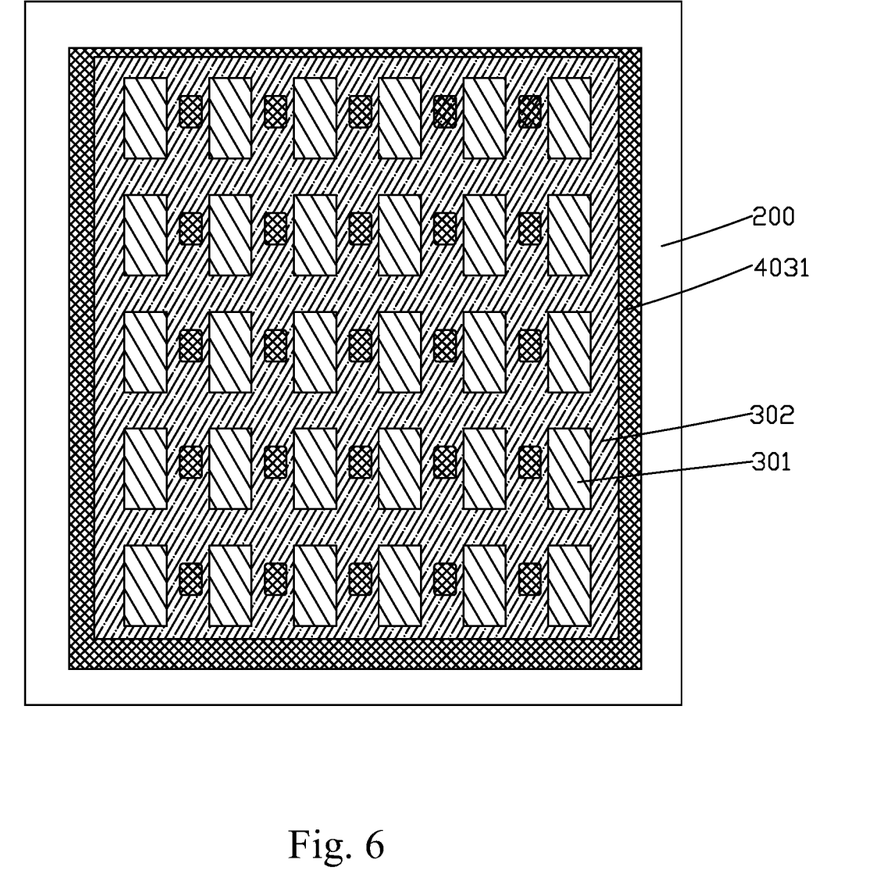
FIG. 6 is a schematic view showing the third shape of the first MOQL in the first embodiment of the OLED display provided by an embodiment of the present invention.
Figure 7:
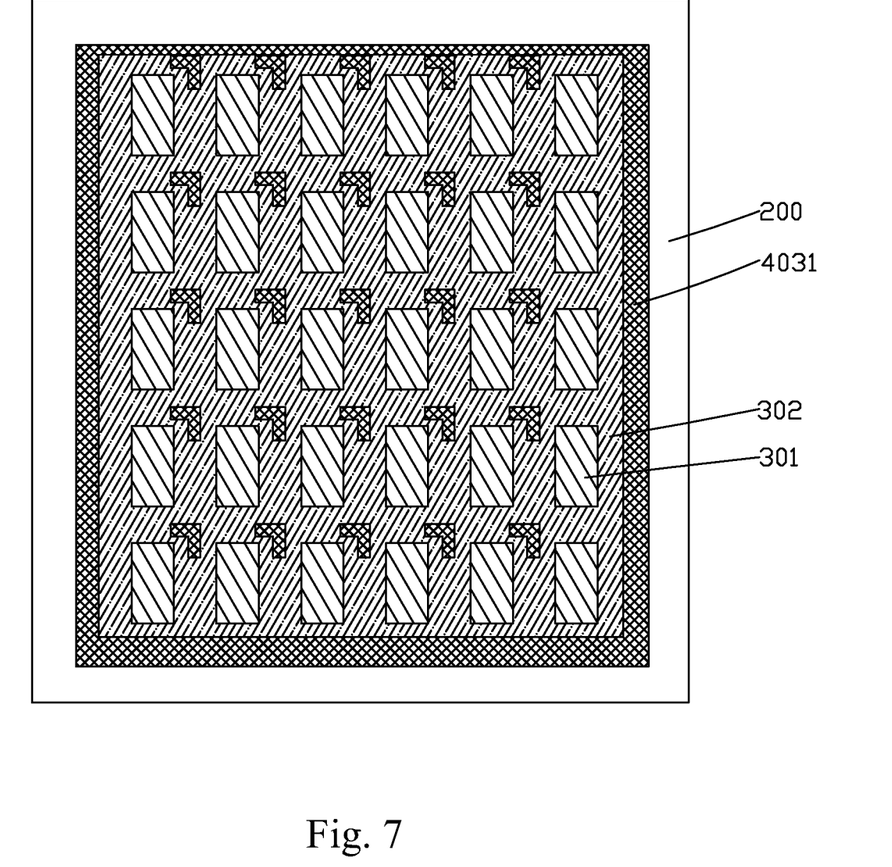
FIG. 7 is a schematic view showing the fourth shape of the first MOQL in the first embodiment of the OLED display provided by an embodiment of the present invention.
Figure 8:
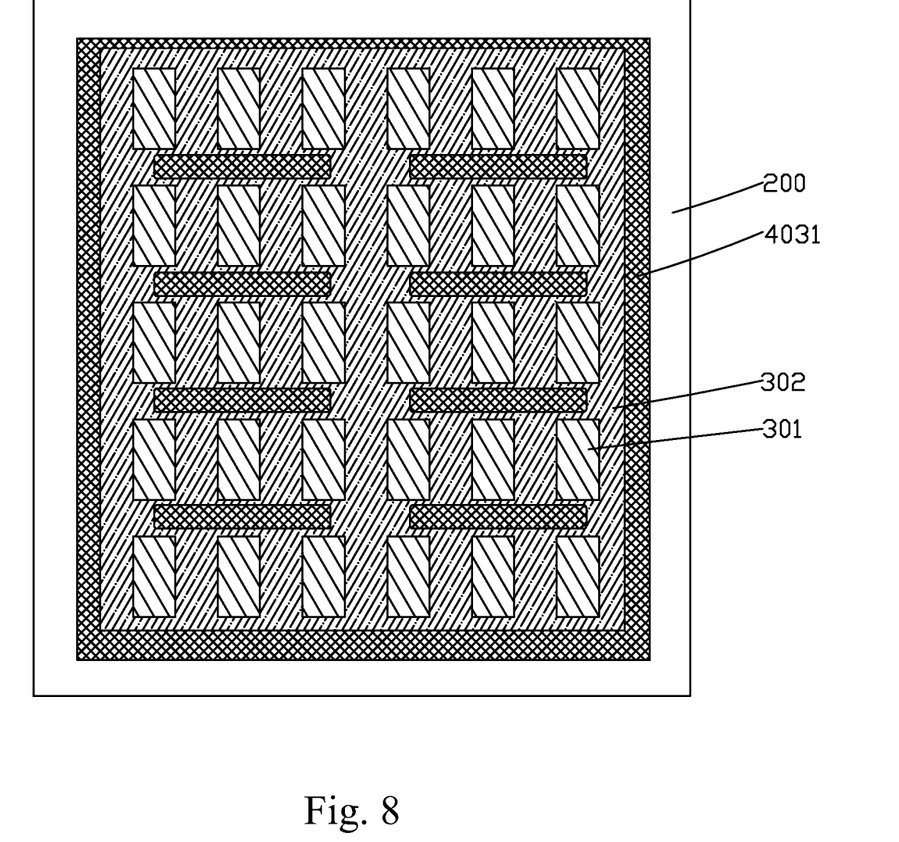
FIG. 8 is a schematic view showing the fifth shape of the first MOQL in the first embodiment of the OLED display provided by an embodiment of the present invention.
Figure 9:
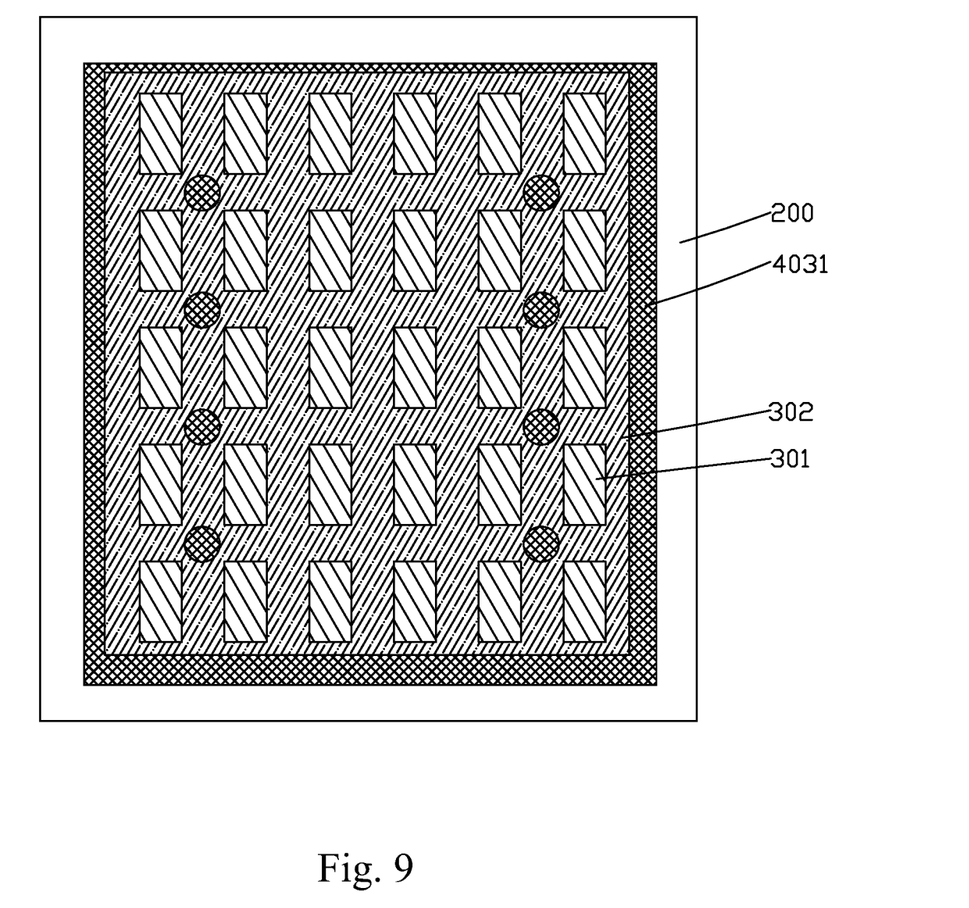
FIG. 9 is a schematic view showing the sixth shape of the first MOQL in the first embodiment of the OLED display provided by an embodiment of the present invention.

Referring to FIG. 3, the present invention provides an OLED display, which comprises: a base substrate 100, a thin film transistor (TFT) array layer 200 disposed on the base substrate 100, an OLED layer 300 disposed on the TFT array layer 200, and a thin film encapsulation (TFE) layer 400 on the TFT array layer 200 and the OLED layer 300 and covering the OLED layer 300.

The TFE layer 400 comprises: inorganic passivation layers 401, organic buffer layers 402 and a moisture/oxygen quenching layer (MOQL) 403, the inorganic passivation layers 401 and the organic buffer layers 402 are alternatively stacked in the TFE layer 400, with the number of the inorganic passivation layers 401 is more than the number of the organic buffer layers 402 by one layer, and the inorganic passivation layers 401 and the organic buffer layers 402 form a stack structure.

The MOQL 403 comprises a first MOQL 4031, a second MOQL 4032, or a combination of the above two, wherein the first MOQL 4031 is disposed on the OLED layer 300 located between the stack structure and the OLED layer 300, and the second MOQL 4032 is disposed inside the stack structure, located between two inorganic passivation layers 401. Specifically, as shown in FIG. 3, the MOQL 403 is the first MOQL 4031 in the instant embodiment.

Specifically, the OLED display comprises an active area (AA) at the center and a non-active area surrounding the active area; and the active area comprises a plurality of sub-pixel areas arranged in an array, and a plurality of remaining gap areas.

Specifically, the TFT array layer 200 comprises a plurality of TFT devices arranged in an array with each TFT device corresponding to a sub-pixel area, wherein the TFT devices use a-Si, LTPS, oxide semiconductor to fabricate the active layer.

Specifically, the OLED layer 300 comprises a plurality of OLED devices arranged in an array with each OLED device corresponding to a sub-pixel area. Each OLED device comprises, from top to bottom, an anode, an organic layer 301, and a cathode 302. The organic layer 301 comprises, from top to bottom, a hole inject layer, a hole transport layer, a light-emitting layer, an electron transport layer and an electron inject layer, wherein the cathode 302 of the plurality of OLED devices is of a planar structure in entirety, with the four edges of the cathode 302 extend from the active area to non-active area. The cathode 302 is formed by Mg and Ag co-evaporation, wherein the ratio between Mg and Ag in the cathode 302 can be adjusted according to device performance. Specifically, the ratio between Mg and Ag is from 1:9 to 9:1.

Specifically, the material for the first MOQL 4031 comprises alkali metals (such as, Li, Na, K, Ru, and Cs), alkaline earth metals (such as, Mg, Ca, and B), or alloys of the above two. When the moisture/oxygen permeates into the OLED device, the first MOQL 4031 has a chemical activity higher than the cathode 302 and organic layer 301. Through chemical reaction, the first MOQL 4031 reacts with the moisture/oxygen so as to prevent the damage to the organic layer 301 and cathode 302 of the OLED device.

Specifically, the material for the inorganic passivation layer 401 comprises silicon nitride (SiN), silicon oxide ($SiO_x$), aluminum oxide ($Al_2O_3$), titanium oxide ($TiO_2$), or zirconium oxide ($ZrO_2$); and the organic buffer layer 402 is a polymer transparent material, such as, acrylic, polycarbonate-based polymer, and polystyrene, so that the stress in the film formation process of the inorganic passivation layer 401 can be effectively relieved.

Preferably, the material of the first MOQL 4031 is an alloy of one or more of Li, Na, K, Ru, Cs, Mg, Ca, and Ba.

Specifically, the first MOQL 4031 is distributed in the non-active areas and the gap areas inside the active area to avoid affecting the luminance effect of the sub-pixel areas. The first MOQL 4031 comprises a ring-shaped peripheral portion and a center portion located inside the ring-shaped peripheral portion.

Specifically, the in the non-active area, the peripheral portion of the first MOQL 4031 completely covers the cathode ring of the cathode 302 in the non-active area, as shown in FIGS. 4-9. The center portion of the first MOQL 4031 is designed according to the actual manufacture process. The center portion of the MOQL 4031 can be an entirety of a network corresponding to the gap areas surrounding each sub-pixel area, or a combination of a plurality of quenching individuals in round, square (including with rounded corner), rectangular, L-shaped, or other shapes distributed around the sub-pixel areas, wherein each quenching individual corresponds to one or more sub-pixel areas, or each sub-pixel area corresponds to a plurality of quenching individuals.

Specifically, the thickness of the first MOQL 4031 is 5 nm-100 nm.

Specifically, the base substrate 100 is a flexible substrate.

In the first embodiment of the OLED display of the present invention, a first MOQL 4031 is introduced on the OLED layer 300. Without affecting the luminance of the OLED device, the first MOQL 4031 prevents, through chemical reaction, the moisture/oxygen from damaging the OLED device so as to improve the lifespan of the OLED device and effectively reduce the number of layers and the thickness of the TFE layer 400, which reduces the overall thickness of the OLED display and improve the flexibility of the flexible OLED.

Figure 10:
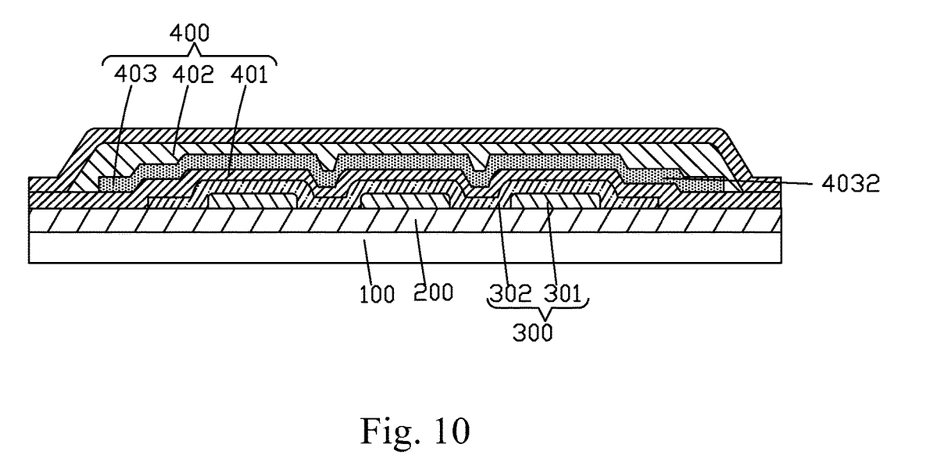
FIG. 10 is a schematic view showing the structure of the second embodiment of the OLED display provided by an embodiment of the present invention.

FIG. 10 is a schematic view of the second embodiment of the OLED of the present invention. Compared to the first embodiment, the MOQL 402 in the second embodiment is the second MOQL 4032.

Specifically, the second MOQL 4032 is located between an inorganic passivation layer 401 and an organic buffer layer 402, and the second MOQL 4032 is disposed on the inorganic passivation layer 401 with the upper and lower surfaces of the second MOQL 4032 contacting the organic buffer layer 402 and the inorganic passivation layer 401 respectively. The material of the second MOQL 4032 is different from the material of the first MOQL 4031. The second MOQL 4032 is made of a physisorption material with diaphaneity and hygroscopicity, wherein the physisorption material is a transparent porous silica gel, a micro-nano composite structured silica gel, or a propylene resin, and so on materials with high diaphaneity; and the second MOQL 4032 has a thickness of 5 nm to 100 nm. The remaining of the second embodiment is the same as those of the first embodiment and will not be described here.

In the second embodiment of the OLED display of the present invention, a second MOQL 4032 with high diaphaneity is introduced into the stack structure of the inorganic passivation layer 401 and the organic buffer layer 402. Without affecting the luminance of the OLED device, the second MOQL 4032 prevents, through chemical reaction, the moisture/oxygen from damaging the OLED device so as to improve the lifespan of the OLED device and effectively reduce the number of layers and the thickness of the TFE layer 400, which reduces the overall thickness of the OLED display and improve the flexibility of the flexible OLED.

Figure 11:
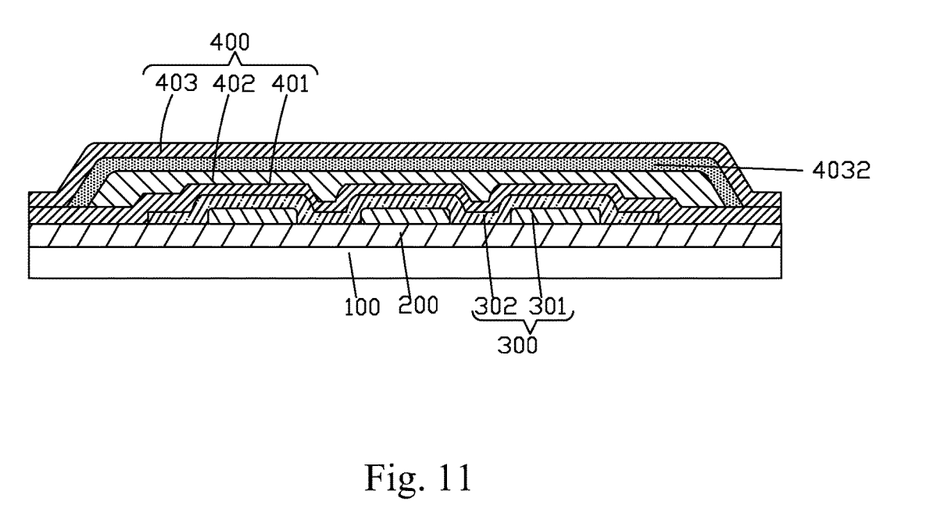
FIG. 11 is a schematic view showing the structure of the third embodiment of the OLED display provided by an embodiment of the present invention.

FIG. 11 is a schematic view of the third embodiment of the OLED of the present invention. Compared to the second embodiment, the second MOQL 4032 in the second embodiment is located between an inorganic passivation layer 401 and an organic buffer layer 402, and the second MOQL 4032 is disposed on the organic buffer layer 402 with the upper and lower surfaces of the second MOQL 4032 contacting the inorganic passivation layer 401 and the organic buffer layer 402 respectively. The remaining of the third embodiment is the same as those of the second embodiment and will not be described here.

Figure 12:
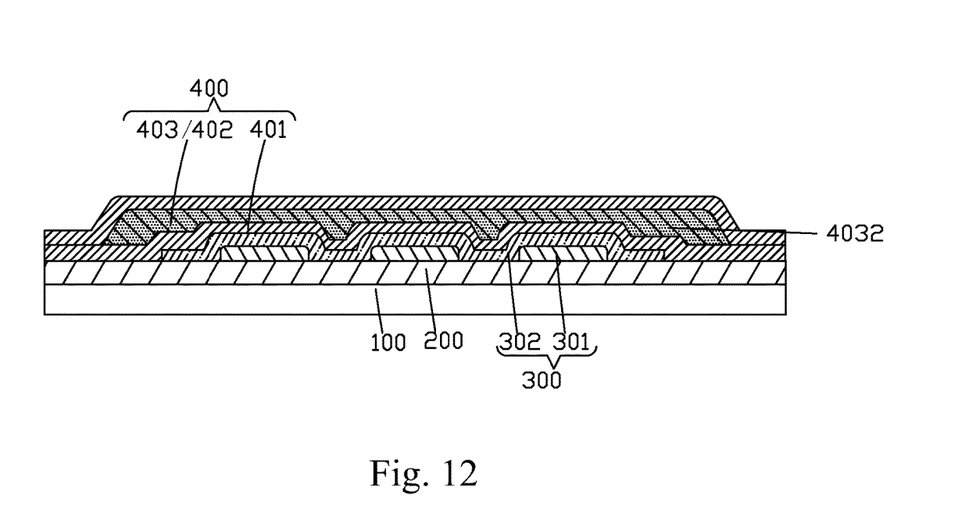
FIG. 12 is a schematic view showing the structure of the fourth embodiment of the OLED display provided by an embodiment of the present invention.

FIG. 12 is a schematic view of the fourth embodiment of the OLED of the present invention. Compared to the second embodiment, the second MOQL 4032 in the fourth embodiment is a film layer formed by a physisorption material with diaphaneity and hygroscopicity uniformly distributed in an organic material, and the second MOQL 4032 also serves as an organic buffer layer.

Specifically, the second MOQL 4032 is a film layer formed by a physisorption material of nano-scale or micro-scale with granular shape uniformly distributed in an organic material. The physisorption material has a size of 10 nm to 10 um, for example, the p physisorption material is made into nano-scaled or micro-scaled microspheres, and then uniformly dispersed in an organic material to form a film layer to obtain the second MOQL 4032. The remaining of the fourth embodiment is the same as those of the second embodiment and will not be described here.

Figure 13:
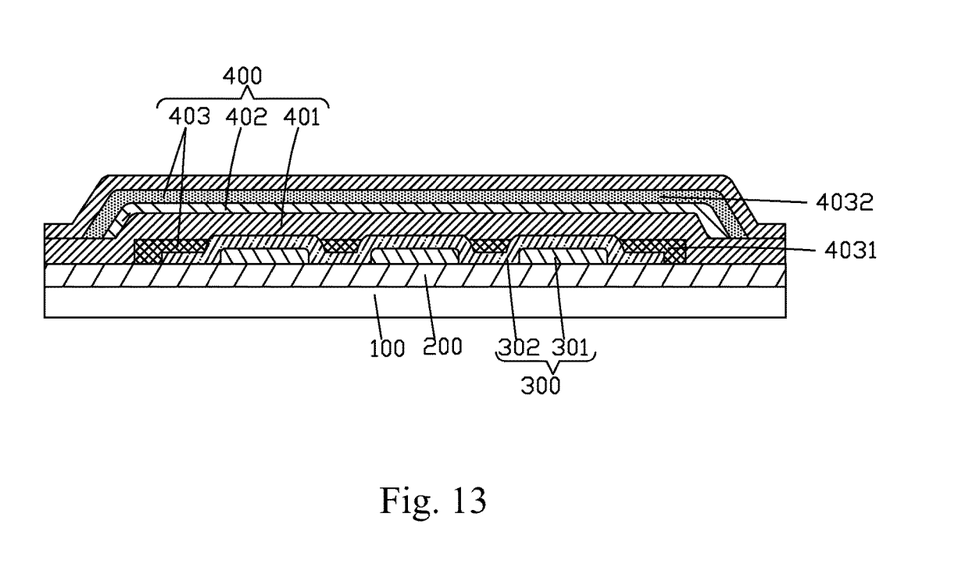
FIG. 13 is a schematic view showing the structure of the fifth embodiment of the OLED display provided by an embodiment of the present invention.

FIG. 13 is a schematic view of the fifth embodiment of the OLED of the present invention. Compared to the second embodiment, the MOQL 403 in the fifth embodiment is a combination of the first MOQL 4031 and the second MOQL 4032, wherein the second MOQL 4032 is made of a physisorption material with diaphaneity and hygroscopicity; the first MOQL 4031 prevents, through chemical reaction, moisture/oxygen from damaging the OLED device and the second MOQL 4032 prevents, through physisorption, moisture/oxygen from damaging the OLED device. The remaining of the fifth embodiment is the same as those of the first embodiment and will not be described here.

In summary, the OLED provides by the present invention has a TFE layer comprising inorganic passivation layers, organic buffer layers and a moisture/oxygen quenching layer MOQL, wherein the inorganic passivation layers and the organic buffer layers together form a stacked structure, and the moisture/oxygen quenching layer comprises a first MOQL located between the stack structure and the OLED layer, or a second MOQL located between the two inorganic passivation layers in the stack structure, or a combination of the two. In the TFE layer, the MOQL can effectively prevent, through the physisorption or the chemical reaction and collaborating with the inorganic passivation layer and the organic buffer layer, the damage of the OLED device caused by the moisture/oxygen without affecting the luminescence performance of the OLED device so as to enhance the lifespan of OLED devices, as well as release the stress of the inorganic passivation layers in the TFE layer, reduce the number of layers and thickness of the TFE layer, thereby reduce the thickness of the OLED display and improve the flexibility of flexible OLED display.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. An organic light-emitting diode (OLED) display, which comprises: a base substrate, a thin film transistor (TFT) array layer disposed on the base substrate, an OLED layer disposed on the TFT array layer, and a thin film encapsulation (TFE) layer on the TFT array layer and the OLED layer and covering the OLED layer;

the TFE layer comprising: inorganic passivation layers, organic buffer layers and a moisture/oxygen quenching layer (MOQL), the inorganic passivation layers and the organic buffer layers being alternatively stacked in the TFE layer, with the number of the inorganic passivation layers being more than the number of the organic buffer layers by one layer, and the inorganic passivation layers and the organic buffer layers forming a stack structure; and the MOQL comprising a first MOQL, a second MOQL, or a combination of the above two, wherein the first MOQL being disposed on the OLED layer located between the stack structure and the OLED layer, and the second MOQL being disposed inside the stack structure, located between two inorganic passivation layers.

2. The OLED display as claimed in claim 1, wherein the OLED display comprises an active area at the center and a non-active area surrounding the active area; the active area comprises a plurality of sub-pixel areas arranged in an array, and a plurality of remaining gap areas;

the first MOQL comprises a ring-shaped peripheral portion and a center portion located inside the ring-shaped peripheral portion; the peripheral portion is disposed to correspond to the non-active area and the center portion is distributed correspondingly to the gap areas inside the active area; the center portion is an entirety of a network structure corresponding to the gap areas or a combination of a plurality of quenching individuals distributed in the gap area.

3. The OLED display as claimed in claim 2, wherein the material for the first MOQL comprises alkali metals, alkaline earth metals, or alloys of the above two.

4. The OLED display as claimed in claim 3, wherein the material for the first MOQL comprises one of Li, Na, K, Ru, Cs, Mg, Ca, and Ba or alloys of the above.

5. The OLED display as claimed in claim 2, wherein the quenching individual is round, rectangular or L-shaped;

each quenching individual corresponds to one or more sub-pixel areas, or each sub-pixel area corresponds a plurality of quenching individuals.

6. The OLED display as claimed in claim 1, wherein the thickness of the first MOQL and the thickness of the second MOQL are both 5 nm-100 nm.

7. The OLED display as claimed in claim 1, wherein the second MOQL is located between an inorganic passivation layer and an organic buffer layer, the upper and lower surfaces of the second MOQL contact the organic buffer layer and the inorganic passivation layer respectively; the second MOQL is made of a physisorption material with diaphaneity and hygroscopicity.

8. The OLED display as claimed in claim 1, wherein the second MOQL is located between an inorganic passivation layer and an organic buffer layer, the upper and lower surfaces of the second MOQL contact the inorganic passivation layer and the organic buffer layer respectively; the second MOQL is made of a physisorption material with diaphaneity and hygroscopicity.

9. The OLED display as claimed in claim 1, wherein the second MOQL is a film layer formed by a physisorption material with diaphaneity and hygroscopicity uniformly distributed in an organic material, and the second MOQL also serves as an organic buffer layer.

10. The OLED display as claimed in claim 9, wherein the second MOQL is a film layer formed by a physisorption material of granular shape uniformly distributed in an organic material.

11. An organic light-emitting diode (OLED) display, which comprises: a base substrate, a thin film transistor (TFT) array layer disposed on the base substrate, an OLED layer disposed on the TFT array layer, and a thin film encapsulation (TFE) layer on the TFT array layer and the OLED layer and covering the OLED layer;

the TFE layer comprising: inorganic passivation layers, organic buffer layers and a moisture/oxygen quenching layer (MOQL), the inorganic passivation layers and the organic buffer layers being alternatively stacked in the TFE layer, with the number of the inorganic passivation layers being more than the number of the organic buffer layers by one layer, and the inorganic passivation layers and the organic buffer layers forming a stack structure;

the MOQL comprising a first MOQL, a second MOQL, or a combination of the above two, wherein the first MOQL being disposed on the OLED layer located between the stack structure and the OLED layer, and the second MOQL being disposed inside the stack structure, located between two inorganic passivation layers;

wherein the thickness of the first MOQL and the thickness of the second MOQL being both 5 nm-100 nm;

wherein the OLED display comprising an active area at the center and a non-active area surrounding the active area; the active area comprising a plurality of sub-pixel areas arranged in an array, and a plurality of remaining gap areas; and the first MOQL comprising a ring-shaped peripheral portion and a center portion located inside the ring-shaped peripheral portion; the peripheral portion being disposed to correspond to the non-active area and the center portion is distributed correspondingly to the gap areas inside the active area; the center portion being an entirety of a network structure corresponding to the gap areas or a combination of a plurality of quenching individuals distributed in the gap area.

12. The OLED display as claimed in claim 11, wherein the material for the first MOQL comprises alkali metals, alkaline earth metals, or alloys of the above two.

13. The OLED display as claimed in claim 12, wherein the material for the first MOQL comprises one of Li, Na, K, Ru, Cs, Mg, Ca, and Ba or alloys of the above.

14. The OLED display as claimed in claim 11, wherein the quenching individual is round, rectangular or L-shaped;

each quenching individual corresponds to one or more sub-pixel areas, or each sub-pixel area corresponds a plurality of quenching individuals.

15. The OLED display as claimed in claim 11, wherein the second MOQL is located between an inorganic passivation layer and an organic buffer layer, the upper and lower surfaces of the second MOQL contact the organic buffer layer and the inorganic passivation layer respectively; the second MOQL is made of a physisorption material with diaphaneity and hygroscopicity.

16. The OLED display as claimed in claim 11, wherein the second MOQL is located between an inorganic passivation layer and an organic buffer layer, the upper and lower surfaces of the second MOQL contact the inorganic passivation layer and the organic buffer layer respectively; the second MOQL is made of a physisorption material with diaphaneity and hygroscopicity.

17. The OLED display as claimed in claim 11, wherein the second MOQL is a film layer formed by a physisorption material with diaphaneity and hygroscopicity uniformly distributed in an organic material, and the second MOQL also serves as an organic buffer layer.

18. The OLED display as claimed in claim 17, wherein the second MOQL is a film layer formed by a physisorption material of granular shape uniformly distributed in an organic material.

* * * * *